US011327215B2

(12) United States Patent
Dong et al.

(10) Patent No.: US 11,327,215 B2
(45) Date of Patent: May 10, 2022

(54) COLLIMATING BACKLIGHT MODULE, PREPARATION METHOD THEREOF AND DISPLAY DEVICE

(71) Applicant: BOE Technology Group Co., Ltd., Beijing (CN)

(72) Inventors: Shuilang Dong, Beijing (CN); Xiandong Meng, Beijing (CN); Wenqu Liu, Beijing (CN); Jifeng Tan, Beijing (CN); Wei Tan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 40 days.

(21) Appl. No.: 16/649,651

(22) PCT Filed: Mar. 29, 2019

(86) PCT No.: PCT/CN2019/080619
§ 371 (c)(1),
(2) Date: Mar. 21, 2020

(87) PCT Pub. No.: WO2020/199015
PCT Pub. Date: Oct. 8, 2020

(65) Prior Publication Data
US 2021/0255381 A1    Aug. 19, 2021

(51) Int. Cl.
*F21V 8/00*  (2006.01)
*G02B 1/14*  (2015.01)
(Continued)

(52) U.S. Cl.
CPC .............. *G02B 6/0036* (2013.01); *C23F 1/02* (2013.01); *G02B 1/14* (2015.01); *G02B 6/0055* (2013.01); *G02B 6/0096* (2013.01); *G03F 7/0005* (2013.01)

(58) Field of Classification Search
CPC ...... G02B 6/0036; G02B 1/14; G02B 6/0055; G02B 6/0096; C23F 1/02; G03F 7/0005
(Continued)

(56) References Cited

U.S. PATENT DOCUMENTS 6,020,944 A * 2/2000 Hoshi ................. G02B 6/0056
349/62
10,585,231 B2 * 3/2020 Kim ..................... G02B 6/0068
(Continued)

FOREIGN PATENT DOCUMENTS

CN         104576401 A     4/2015
CN         107238974 A    10/2017
(Continued)

*Primary Examiner* — Andrew J Coughlin
*Assistant Examiner* — Jessica M Apenteng
(74) *Attorney, Agent, or Firm* — ArentFox Schiff LLP; Michael Fainberg

(57) ABSTRACT

The present disclosure provides a collimating backlight module, a preparation method thereof and a display device. The method for preparing the collimating backlight module includes: providing a light guide plate; forming a protective layer on a light emitting side of the light guide plate, where the protective layer simultaneously covers a light emitting area and a non-light emitting area of the light emitting side, a hollow area is formed on the protective layer, to expose the light emitting area of the light guide plate; and forming a light taking grating on the light emitting area of the light guide plate.

17 Claims, 12 Drawing Sheets

(51) Int. Cl.
*C23F 1/02* (2006.01)
*G03F 7/00* (2006.01)

(58) Field of Classification Search
USPC .......................................................... 362/606
See application file for complete search history.

(56) References Cited

U.S. PATENT DOCUMENTS

| | | | | |
|---|---|---|---|---|
| 2011/0187964 A1* | 8/2011 | Li | .......................... | G02F 1/1335 |
| | | | | 349/62 |
| 2014/0146521 A1* | 5/2014 | Kim | .................. | G02F 1/133615 |
| | | | | 362/97.1 |
| 2017/0059961 A1 | 3/2017 | Park et al. | | |

FOREIGN PATENT DOCUMENTS

| | | | |
|---|---|---|---|
| CN | 108365129 | A | 8/2018 |
| CN | 109061948 | A | 12/2018 |
| CN | 109459814 | A | 3/2019 |

\* cited by examiner

COLLIMATING BACKLIGHT MODULE, PREPARATION METHOD THEREOF AND DISPLAY DEVICE

This application is a National Stage of International Application No. PCT/CN2019/080619, filed Mar. 29, 2019, which is hereby incorporated by reference in its entirety.

TECHNICAL FIELD

The present disclosure relates to the field of display technology, in particular to a collimating backlight module, a preparation method thereof and a display device.

BACKGROUND

In the display technology of a collimating light source, a backlight module generally adopts a realization mode of a collimating backlight module to emit a collimating light. Where, the light emitted by a light source in the collimating backlight module is coupled to a light guide plate, and is transmitted by total reflection within the light guide plate. Through setting a light taking grating on the surface of the light guide plate, the light transmitted by total reflection in the light guide plate is taken out at a collimating angle by the light taking grating, and a collimating light source is realized.

SUMMARY

An embodiment of the present disclosure provides a method for preparing a collimating backlight module, including: providing a light guide plate; forming a protective layer on a light emitting side of the light guide plate, where the protective layer simultaneously covers a light emitting area and a non-light emitting area of the light emitting side, a hollow area is formed on the protective layer, to expose the light emitting area of the light guide plate; and forming a light taking grating on the light emitting area of the light guide plate.

Optionally, in an embodiment of the present disclosure, after forming a light taking grating on the light emitting area of the light guide plate, the method further includes: removing the protective layer of the non-light emitting area of the light guide plate.

Optionally, in an embodiment of the present disclosure, the forming a protective layer on a light emitting side of the light guide plate, where the protective layer simultaneously covers a light emitting area and a non-light emitting area of the light emitting side, a hollow area is formed on the protective layer, to expose the light emitting area of the light guide plate includes: forming at least one protective layer selected from a metal protective layer, a metal alloy protective layer and a metal oxide protective layer on the light guide plate; and performing wet etching on the formed protective layer, and forming a hollow area on the protective layer, to expose the light emitting area of the light guide plate.

Optionally, in an embodiment of the present disclosure, the forming a metal oxide protective layer on the light guide plate includes: forming at least one protective layer selected from an IGZO protective layer, an ITO protective layer and an IZO protective layer on the light guide plate.

Optionally, in an embodiment of the present disclosure, before forming a light taking grating on the light emitting area of the light guide plate, the method further includes: performing annealing treatment on the protective layer at a temperature range of 200° C. to 400° C.

Optionally, in an embodiment of the present disclosure, the removing the protective layer of a non-light emitting area of the light guide plate includes: removing the protective layer with an etching liquid, where the etching liquid includes: sulfuric acid, nitric acid, additives and deionized water.

Optionally, in an embodiment of the present disclosure, before removing the protective layer of a non-light emitting area of the light guide plate, the method further includes: forming an anti-etching protective layer, which only covers the light taking grating, on the light guide plate.

Optionally, in an embodiment of the present disclosure, the forming an anti-etching protective layer which only covers the light taking grating includes: forming a photoresist layer, which only covers the light taking grating, on the light guide plate formed with the light taking grating.

Optionally, in an embodiment of the present disclosure, the thickness of the formed protective layer ranges from 10 nm to 40 nm.

Optionally, in an embodiment of the present disclosure, the forming a light taking grating on the light emitting area of the light guide plate before removing the protective layer of a non-light emitting area of the light guide plate includes: forming an insulating layer, which covers the light guide plate, on the light guide plate, where the refractive index of the insulating layer is greater than the refractive index of the light guide plate; adopting a composition process to enable the insulating layer to form grating structures on each area of the light guide plate; forming a photoresist layer with multiple opening areas on the grating structure, where the opening areas are overlapped with the non-light emitting area of the collimating backlight module; adopting a dry etching process to remove the grating structure in the corresponding non-light emitting area and reserve the protective layer of the non-light emitting area; and peeling off the photoresist layer, and forming the light taking grating which is only located in the light emitting area.

Optionally, in an embodiment of the present disclosure, the adopting a composition process to enable the insulating layer to form grating structures on each area of the light guide plate includes: adopting an embossing process or a transfer printing process to enable the insulating layer to form grating structures on each area of the light guide plate.

Optionally, in an embodiment of the present disclosure, the adopting an embossing process to enable the insulating layer to form grating structures on each area of the light guide plate includes: forming an embossing adhesive, which covers the insulating layer, on the light guide plate; embossing simultaneously each area of the embossing adhesive with an embossing template; and adopting a dry etching process to enable the insulating layer to form the grating structure after curing treatment of the embossed embossing adhesive and removal of the embossing template.

Optionally, in an embodiment of the present disclosure, the forming an insulating layer, which covers the light guide plate, on the light guide plate includes: forming a silicon nitride insulating layer, which covers the light guide plate, on the light guide plate.

Optionally, in an embodiment of the present disclosure, the light guide plate is made of glass.

Optionally, in an embodiment of the present disclosure, after removing the protective layer of the non-light emitting area of the light guide plate, the method further includes: forming a planarization layer, which covers the light emitting side of the light guide plate, on the light guide plate.

Optionally, in an embodiment of the present disclosure, after forming a planarization layer, which covers the light emitting side of the light guide plate, on the light guide plate, the method further includes: forming a reflective layer on a side opposite to a light inlet side of the light guide plate; and forming a light source and a reflective cover on the light inlet side of the light guide plate.

An embodiment of the present disclosure further provides a collimating backlight module, where the collimating backlight module is prepared through the above preparation method.

An embodiment of the present disclosure further provides a display device which includes the above collimating backlight module.

DETAILED DESCRIPTION OF THE EMBODIMENTS

Figure 1:
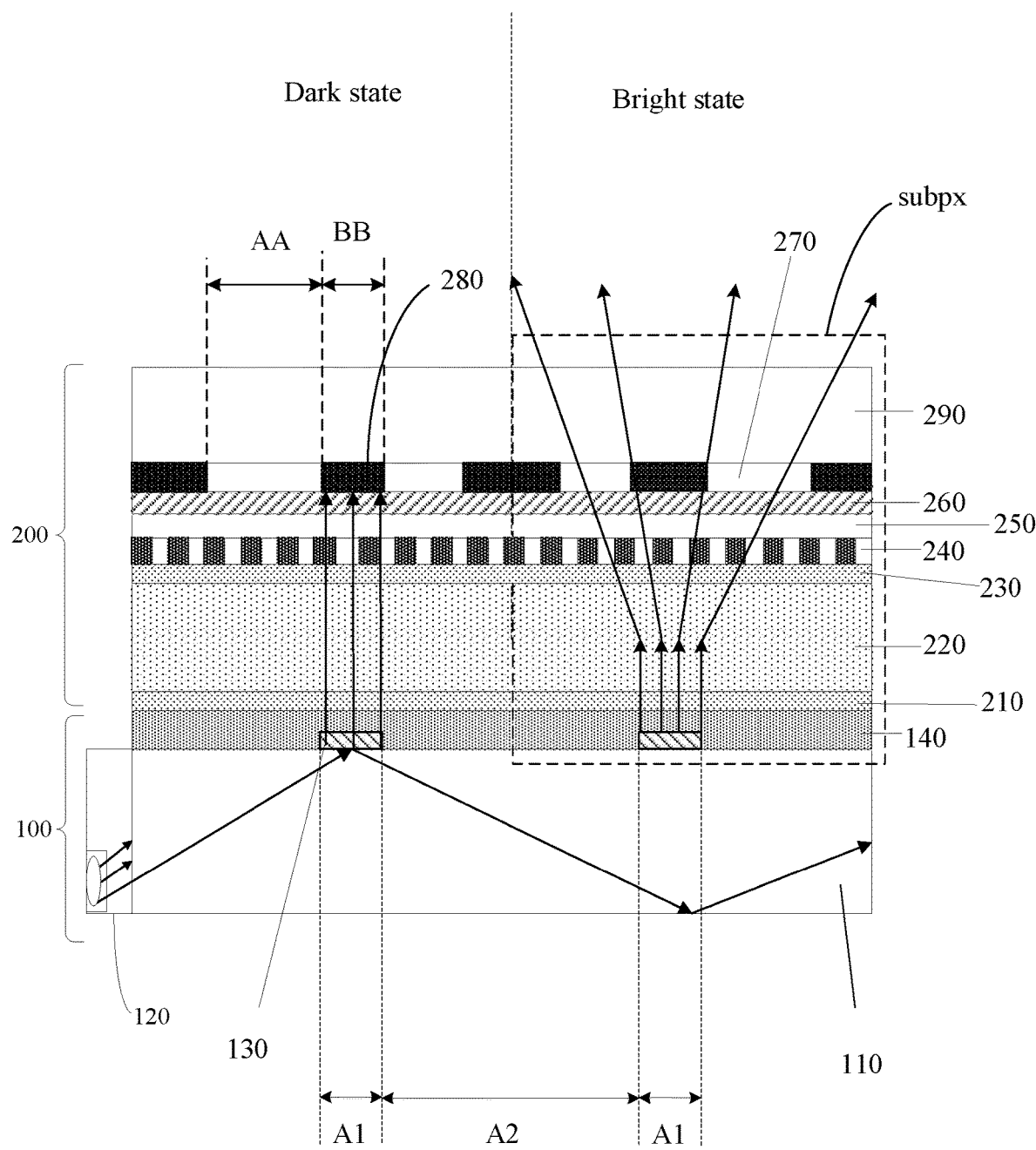
FIG. 1 is a structural schematic diagram of a display device provided in an embodiment of the present disclosure.

In order to make the objectives, technical solutions, and advantages of the present disclosure clearer, a brief description will be given below on specific embodiments of a collimating backlight module, a preparation method thereof and a display device provided in embodiments of the present disclosure in combination with accompanying drawings. It should be understood that, the preferred embodiments described below are merely for illustrating and explaining the present disclosure, rather than for limiting the present disclosure. Moreover, without conflict, embodiments and characteristics in embodiments of the present disclosure may be combined with each other. It should be noted that, in the drawings, the thickness and shape of each layer of film do not reflect the true proportion, merely aiming at schematically illustrating the content of the present disclosure. Moreover, the same or similar reference numerals throughout the text represent the same or similar elements or the element with the same or similar functions.

As shown in FIG. 1, a display device provided with a collimating light source includes: a collimating backlight module 100 and a liquid crystal display (LCD) panel 200 arranged at a light emitting side of the collimating backlight module 100. The collimating backlight module 100 includes: a light guide plate 110, a light source 120, a light taking grating 130 and a planarization layer 140.

Specifically, the collimating backlight module 100 includes a light emitting area A1 and a non-light emitting area A2. The light emitted by the light source 120 is coupled into the light guide plate 110 at a certain central angle, and is transmitted by total reflection within the light guide plate 110. Since a light taking grating 130 is set in the light emitting area A1 of the light guide plate 110, therefore, the light which is incident into the light emitting area A1 may be taken out at a collimating angle through the light taking grating 130, such that light is emitted upwards in a collimating manner.

The LCD panel 200 includes in sequence a first orientation layer 210, a liquid crystal layer 220, a second orientation layer 230, a first transparent electrode layer 240, an insulating layer 250, a second transparent electrode layer 260, a color film layer 270, a light shield layer 280 and an upper substrate 290 which are arranged on the side, deviating from the light guide plate 110, of the planarization layer 140.

The LCD panel 200 includes multiple pixel units, each pixel unit includes multiple sub-pixels subpx, and each sub-pixel subpx includes a light shield area BB and a light-transmitting area AA at two sides of the light shield area BB, where the light shield layer 280 is set corresponding to the light shield area BB, and the color film layer 270 is set corresponding to the light-transmitting area AA.

When the LCD panel 200 is loaded with no electrical signals, the light emitted from the light emitting area A1 will be completely absorbed by the light shield material in the light shield layer 280 of the light shield area BB, at this time, a dark state appears. When the LCD panel 200 is loaded with electrical signals, the refractive index of the liquid crystal layer 220 may be driven to change periodically to constitute a liquid crystal grating, such that the light emitted from the light emitting area A1 is emitted out from the light-transmitting area AA after a diffraction effect of the liquid crystal grating, at this time, a bright state appears for display. Moreover, when the liquid crystal layer 220 is loaded with different electrical signals, different diffraction efficiencies of the liquid crystal grating to the incident light are realized, so as to realize multi-gray-scale display.

Figure 2:
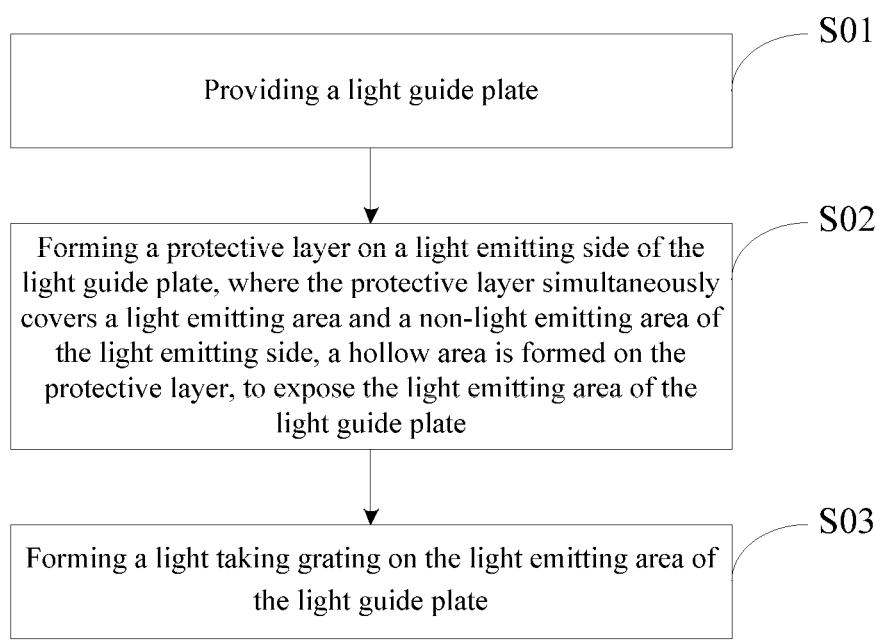
FIG. 2 is a flow chart of a preparation method of a collimating backlight module provided in one or more embodiments of the present disclosure.

An embodiment of the present disclosure provides a method for preparing a collimating backlight module, as shown in FIG. 2, and the method includes the following steps.

S01, providing a light guide plate.

S02, forming a protective layer on a light emitting side of the light guide plate, where the protective layer simultaneously covers a light emitting area and a non-light emitting area of the light emitting side, a hollow area is formed on the protective layer, to expose the light emitting area of the light guide plate. In this way, a protective layer with multiple hollow areas may be formed on the light emitting side of the light guide plate, and the hollow area corresponds to the light emitting area of the collimating backlight module, to expose the light emitting area. The protective layer covers the non-light emitting area.

S03, forming a light taking grating on the light emitting area of the light guide plate.

As to the method for preparing a collimating backlight module provided in an embodiment of the present disclosure, a protective layer with multiple hollow areas is firstly formed on the light guide plate before the light guide grating is formed, such that the protective layer covers the light guide plate corresponding to the non-light emitting area, to protect the non-light emitting area of the light guide plate. In this way, when the light taking grating is formed on the light guide plate corresponding to the area in which the light emitting area is located, due to the protective effect of the protective layer on the non-light emitting area of the light guide plate, the light guide plate may be avoided from being etched, such that the surface evenness of the non-light emitting area of the light guide plate is favorable, and light leakage of the non-light emitting area is reduced. Further, when the collimating backlight module prepared through the above method is applied to a display device, the display effect may be improved.

During specific implementation, in an embodiment of the present disclosure, the thickness of the formed protective layer ranges from 10 nm to 40 nm. Exemplarily, the thickness of the formed protective layer may be 10 nm, 20 nm, 30 nm or 40 nm, and will not be defined herein.

Figure 3:
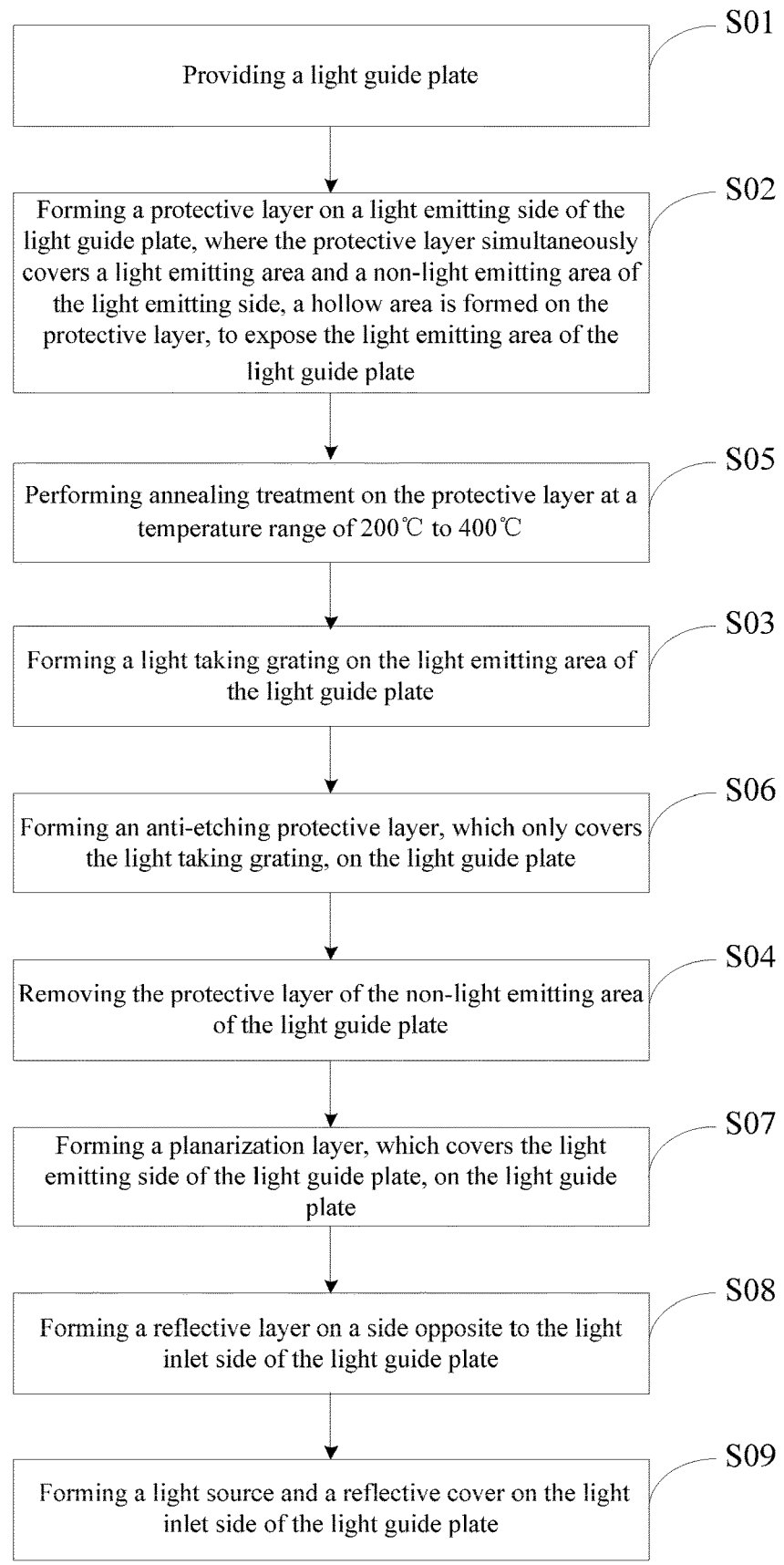
FIG. 3 is a flow chart of a preparation method of a collimating backlight module provided in one or more embodiments of the present disclosure.

In order to avoid the protective layer in the non-light emitting area from causing light leakage to the light guide plate, during specific implementation, in an embodiment of the present disclosure, as shown in FIG. 3, after forming a light taking grating on the light emitting area of the light guide plate in step S03, the method may further include: S04, removing the protective layer of the non-light emitting area of the light guide plate.

During specific implementation, in an embodiment of the present disclosure, the material of the protective layer may be a film layer which may be etched through wet etching, exemplarily, the material may include at least one selected from metal, metal alloy or metal oxide.

During specific implementations, in an embodiment of the present disclosure, a protective layer is formed on the light emitting side of the light guide plate, the protective layer simultaneously covers a light emitting area and a non-light emitting area of the light emitting side, and a hollow area is formed on the protective layer, to expose the light emitting area of the light guide plate, where the following steps may be included: forming at least one protective layer selected from a metal protective layer, a metal alloy protective layer or a metal oxide protective layer on the light guide plate; and performing wet etching on the formed protective layer, and forming a hollow area on the protective layer, to expose the light emitting area of the light guide plate.

Since wet etching generally does not produce a chemical etching effect on a glass light guide plate, therefore, when a wet etching process is adopted to etch the protective layer, the light guide plate may be further avoided from being etched, thereby further enabling the surface evenness of the non-light emitting area of the light guide plate to be favorable, and reducing light leakage of the non-light emitting area.

Figure 4A:
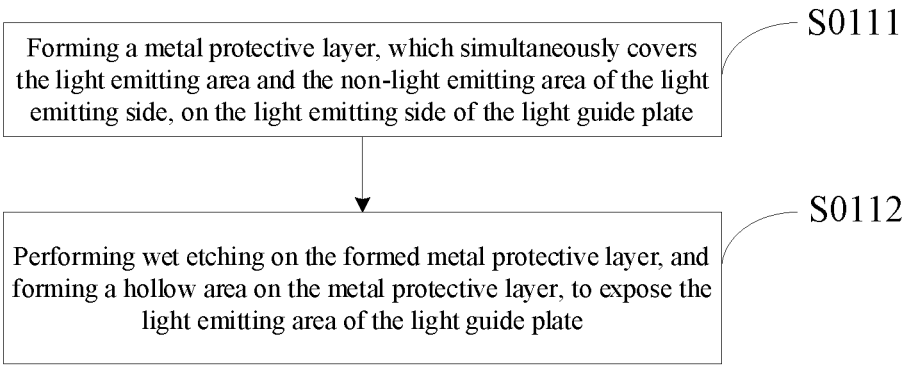
FIG. 4A is a flow chart of a preparation method of a collimating backlight module provided in one or more embodiments of the present disclosure.

Specifically, during specific implementations, in an embodiment of the present disclosure, as shown in FIG. 4A, the forming a protective layer on a light emitting side of the light guide plate, where the protective layer simultaneously covers a light emitting area and a non-light emitting area of the light emitting side, a hollow area is formed on the protective layer, to expose the light emitting area of the light guide plate may include the following steps.

S0111, forming a metal protective layer, which simultaneously covers the light emitting area and the non-light emitting area of the light emitting side, on the light emitting side of the light guide plate.

The material of the metal protective layer may be Al and Cu, etc. For example, the forming a metal alloy protective layer on the light guide plate may include: forming an Al protective layer, which may completely cover the light emitting side of the light guide plate, on the light emitting side of the light guide plate; or, forming a Cu protective layer, which may completely cover the light emitting side of the light guide plate, on the light emitting side of the light guide plate. Of course, during practical applications, a protective layer of other metal materials may also be formed, and this is not defined herein.

S0112, performing wet etching on the formed metal protective layer, and forming a hollow area on the metal protective layer, to expose the light emitting area of the light guide plate.

Figure 4B:
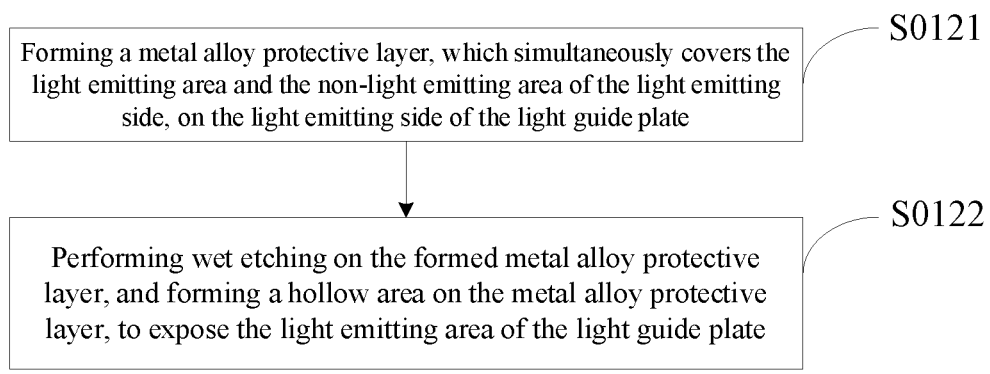
FIG. 4B is a flow chart of a preparation method of a collimating backlight module provided in one or more embodiments of the present disclosure.

Specifically, during specific implementations, in an embodiment of the present disclosure, as shown in FIG. 4B, the forming a protective layer on a light emitting side of the light guide plate, where the protective layer simultaneously covers a light emitting area and a non-light emitting area of the light emitting side, a hollow area is formed on the protective layer, to expose the light emitting area of the light guide plate may include the following steps.

S0121, forming a metal alloy protective layer, which simultaneously covers the light emitting area and the non-light emitting area of the light emitting side, on the light emitting side of the light guide plate.

The metal alloy may be AlNd, etc. For example, the step of forming a metal alloy protective layer on the light guide plate may include: forming an AlNd protective layer, which may completely cover the light emitting side of the light guide plate, on the light emitting side of the light guide plate. Of course, during practical applications, a protective layer of other metal alloy materials may also be formed, and this is not defined herein.

S0122, performing wet etching on the formed metal alloy protective layer, and forming a hollow area on the metal alloy protective layer, to expose the light emitting area of the light guide plate.

Figure 4C:
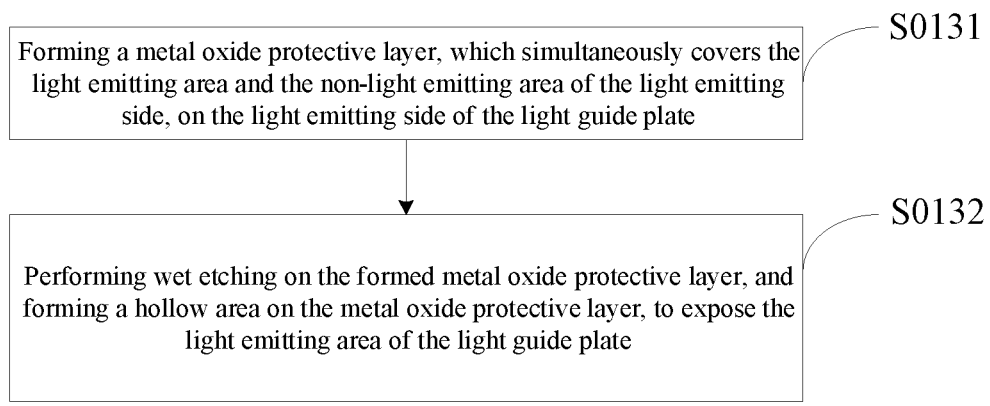
FIG. 4C is a flow chart of a preparation method of a collimating backlight module provided in one or more embodiments of the present disclosure.

Specifically, during specific implementation, in an embodiment of the present disclosure, as shown in FIG. 4C, the forming a protective layer on a light emitting side of the light guide plate, where the protective layer simultaneously covers a light emitting area and a non-light emitting area of the light emitting side, a hollow area is formed on the protective layer, to expose the light emitting area of the light guide plate may include the following steps.

S0131, forming a metal oxide protective layer, which simultaneously covers the light emitting area and the non-light emitting area of the light emitting side, on the light emitting side of the light guide plate, where the metal oxide may be indium tin oxide (ITO), indium gallium zinc oxide (IGZO), indium zinc oxide (IZO), etc. For example, the step of forming a metal oxide protective layer, which completely covers the light emitting side of the light guide plate, on the light emitting side of the light guide plate may include: forming at least one protective layer selected from an IGZO (indium gallium zinc oxide) protective layer, an ITO (indium tin oxide) protective layer, and an IZO (indium zinc oxide) protective layer on the light guide plate. Of course, during practical applications, a protective layer may also be formed via other metal oxide materials, and this is not defined herein.

S0132, performing wet etching on the formed metal oxide protective layer, and forming a hollow area on the metal oxide protective layer, to expose the light emitting area of the light guide plate.

Of course, during specific implementation, two protective layers, selected from a metal protective layer, a metal alloy protective layer and a metal oxide protective layer, which simultaneously cover the light emitting area and the non-light emitting area of the light emitting side may be formed on the light emitting side of the light guide plate.

Further, a metal protective layer, a metal alloy protective layer and a metal oxide protective layer which simultaneously cover the light emitting area and the non-light emitting area of the light emitting side may be formed on the light emitting side of the light guide plate. Of course, specific implementation modes of the protective layer may be designed and determined according to actual application environments, and will not be defined herein.

During specific implementation, after a metal oxide film layer is adopted, a deposition method (for example, a plasma enhanced chemical vapor deposition (PECVD) method) needs to be adopted to form an insulating layer with the refractive index being higher than that of the light guide plate, so as to manufacture a light taking grating on the light guide plate through the insulating layer. When the insulating layer is deposited, the metal in the metal oxide may be precipitated, therefore, an annealing treatment may be first performed on the metal oxide protective layer.

Exemplarily, the material of the protective layer may be set to IGZO. In order to avoid precipitation of In in the protection layer when the light taking grating is formed, in an embodiment of the present disclosure, before a light taking grating is formed in the light emitting area of the light guide plate in step S03, as shown in FIG. 3, the following step may also be included: S05, performing annealing treatment on the protective layer at a temperature range of 200° C. to 400° C. In this way, when a light taking grating is formed, In in the protective layer may be avoided from precipitation, where the temperature may be set to 200° C., 380° C. or 400° C. Of course, specific numerical values of the temperature may be designed and determined according to actual application environments, and will not be defined herein.

During specific implementation, in an embodiment of the present disclosure, the step of removing a protective layer of the non-light emitting area of the light guide plate may include: removing the protective layer with an etching liquid, where the etching liquid may include: sulfuric acid, nitric acid, additives and deionized water. In this way, a wet etching process is generally adopted to remove the protective layer, since the wet etching process generally does not produce a chemical etching effect on a glass light guide plate, therefore, when a wet etching process is adopted to remove the protective layer, the light guide plate may be further avoided from being etched, thereby further enabling the surface evenness of the non-light emitting area of the light guide plate to be favorable, and reducing light leakage of the non-light emitting area.

Optionally, during specific implementation, the mass ratio of sulfuric acid to nitric acid to additives to deionized water in the etching liquid may be selected according to the material of the protective layer in practical applications. For example, if the material of the protective layer is IGZO, optionally, the mass ratio of sulfuric acid to nitric acid to additives to deionized water in the etching liquid may be 8:4.5:2:76. Of course, during practical applications, when the material of the protective layer is IGZO, the mass ratio of sulfuric acid to nitric acid to additives to deionized water in the etching liquid may also be selected from other numerical values which may realize functions of the present disclosure, and the mass ratio is not defined herein.

In order to avoid unfavorable influence on the light taking grating when a protective layer is removed with an etching liquid, during specific implementation, in an embodiment of the present disclosure, as shown in FIG. 3, before removing the protective layer of the non-light emitting area of the light guide plate in step S04, the method may further include: S06, forming an anti-etching protective layer, which only covers the light taking grating, on the light guide plate. In this way, the light taking grating may be protected through an anti-etching protective layer, thereby avoiding unfavorable influence of an etching liquid on the light taking grating when a protective layer is removed.

Optionally, to lower manufacturing cost, the material of the anti-etching protective layer may be set to photoresist. In this way, the light taking grating may be directly covered with an anti-etching protective layer with a photolithographic process, another film layer does not to be formed additionally, thereby reducing process complexity. During specific implementation, in an embodiment of the present disclosure, the step of forming an anti-etching protective layer which only covers the light taking grating may include: forming a photoresist layer, which only covers the light taking grating, on the light guide plate formed with the light taking grating.

Figure 5:
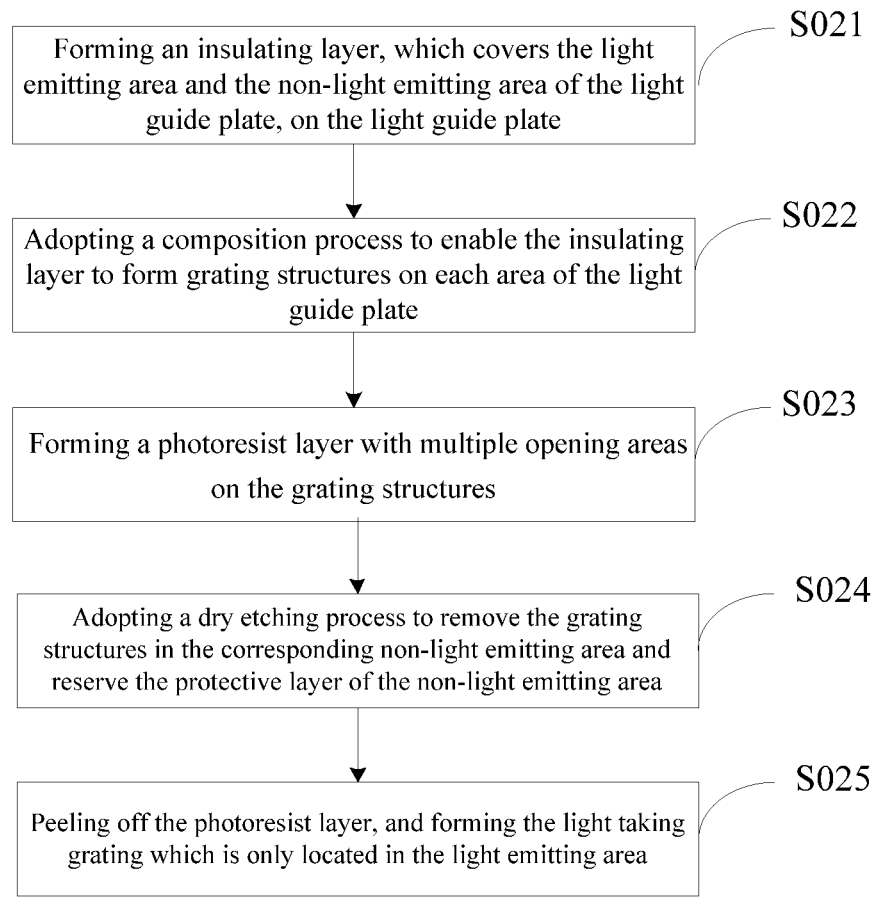
FIG. 5 is a flow chart of a preparation method of a collimating backlight module provided in one or more embodiments of the present disclosure.

During specific implementation, in an embodiment of the present disclosure, as shown in FIG. 5, the step of forming a light taking grating on the light emitting area of the light guide plate before removing the protective layer of the non-light emitting area of the light guide plate may specifically include the following steps.

S021, forming an insulating layer, which covers the light emitting area and the non-light emitting area of the light guide plate, on the light guide plate, where the refractive index of the insulating layer is greater than the refractive index of the light guide plate, thereby ensuring that the light of the light guide plate is totally reflected in the non-light emitting area.

S022, adopting a composition process to enable the insulating layer to form grating structures on each area of the light guide plate.

S023, forming a photoresist layer with multiple opening areas on the grating structure, where the opening areas are overlapped with the non-light emitting area of the collimating backlight module.

S024, adopting a dry etching process to remove the grating structure in the corresponding non-light emitting area and reserve the protective layer of the non-light emitting area.

S025, peeling off the photoresist layer, and forming the light taking grating which is only located in the light emitting area.

During specific implementation, in an embodiment of the present disclosure, the step of adopting a composition process to enable the insulating layer to form grating structures on each area of the light guide plate may include: adopting an embossing process or a transfer printing process to enable the insulating layer to form grating structures on each area of the light guide plate.

Exemplarily, during specific implementation, in an embodiment of the present disclosure, the step of adopting a composition process to enable the insulating layer to form grating structures on each area of the light guide plate may include: adopting a soft film transfer printing process to enable the insulating layer to form grating structures on each area of the light guide plate.

During specific implementation, in an embodiment of the present disclosure, the step of adopting a composition process to enable the insulating layer to form grating structures on each area of the light guide plate may include: adopting an embossing process to enable the insulating layer to form grating structures on each area of the light guide plate.

Figure 6:
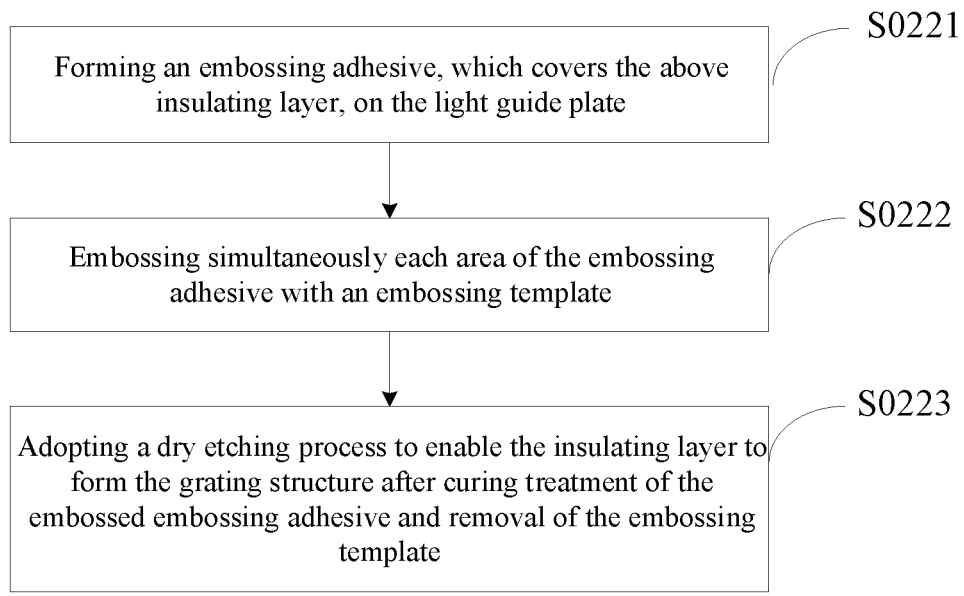
FIG. 6 is a flow chart of a preparation method of a collimating backlight module provided in one or more embodiments of the present disclosure.

Exemplarily, during specific implementation, in an embodiment of the present disclosure, an embossing process is adopted to enable the insulating layer to form grating structures on each area of the light guide plate, as shown in FIG. 6, the following steps may be specifically included.

S0221, forming an embossing adhesive, which covers the above insulating layer, on the light guide plate.

S0222, embossing simultaneously each area of the embossing adhesive with an embossing template.

S0223, adopting a dry etching process to enable the insulating layer to form the grating structure after curing treatment of the embossed embossing adhesive and removal of the embossing template, such that the formed grating structure is finer.

During specific implementation, the material of a light guide plate may include glass. Exemplarily, when the material of the light guide plate is set to be glass, the light guide plate may be made of glass. The light taking grating may be made of materials with a refractive index being greater than the refractive index of glass. A typical glass refractive index is about 1.4, then the light taking grating may adopt materials with the refractive index being greater than 1.4, optionally, the light taking grating may adopt materials at a refractive index of 1.9.

For example, in an embodiment of the present disclosure, the materials of the light taking grating may include silicon nitride, that is, SiNx. Exemplarily, the step of forming an insulating layer, which covers the light guide plate, on the light guide plate may include: forming a silicon nitride insulating layer, which covers the light guide plate, on the light guide plate. Of course, during practical applications, other materials which may realize functions of the present disclosure may also be selected as materials of the light taking grating, and will not be defined herein.

During specific implementation, in an embodiment of the present disclosure, as shown in FIG. 3, after removing the protective layer of the non-light emitting area of the light guide plate in step S04, the method may further include: S07, forming a planarization layer, which covers the light emitting side of the light guide plate, on the light guide plate.

During specific implementation, in an embodiment of the present disclosure, after forming a planarization layer, which covers the light emitting side of the light guide plate, on the light guide plate, as shown in FIG. 3, the method may further include: S08, forming a reflective layer on a side opposite to the light inlet side of the light guide plate; and S09, forming a light source and a reflective cover on the light inlet side of the light guide plate.

The method for preparing a collimating backlight module is enumerated below through embodiments, however, readers should understand that, the specific processes are not limited herein. The method for preparing a collimating backlight module provided in an embodiment of the present disclosure may include the following steps.

(1) providing a light guide plate 110 with a glass substrate, forming an IGZO protective layer, which simultaneously covers the light emitting area A1 and the non-light emitting area A2 on the light emitting side of the light guide plate 110, on the light guide plate 110, and forming a hollow area Q1 on the protective layer, to expose the light emitting area A1 of the light guide plate 110, so as to form an IGZO protective layer 410 with multiple hollow areas Q1 on the light guide plate 110.

Figure 7A:
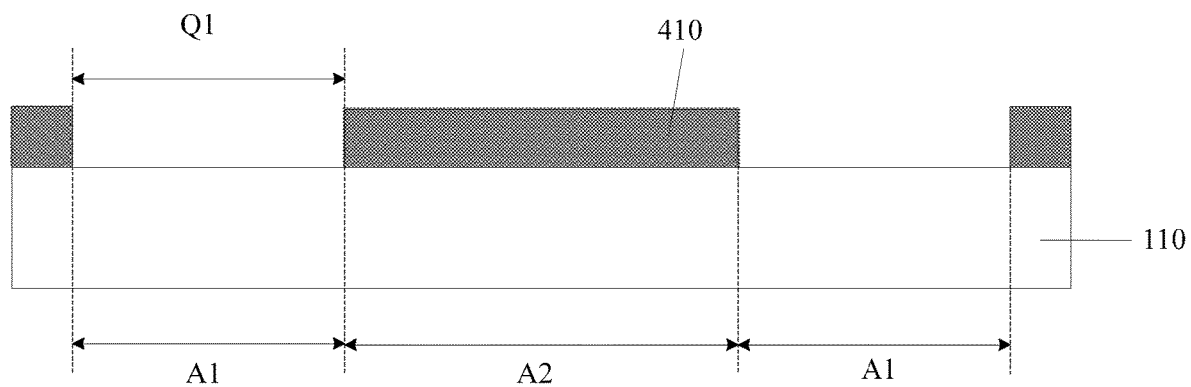
FIGS. 7A to 7M are respectively sectional view schematic diagrams of a backlight module obtained corresponding to each manufacturing step in the preparation method of the collimating backlight module provided in an embodiment of the present disclosure.

As shown in FIG. 7A, the hollow area Q1 is overlapped with the light emitting area A1 of the collimating backlight module, the orthographic projection of the IGZO protective layer 410 in the light guide plate 110 is overlapped with the non-light emitting area A2 of the collimating backlight module, to cover the non-light emitting area A2 of the light guide plate 110. Where, in the direction vertical to the light guide plate 110, the thickness of the IGZO protective layer 410 may be 20 nm.

Specifically, a complete IGZO protective layer is formed on the light guide plate 110. Afterwards, a photolithographic process and a wet etching process are adopted in sequence, to remove the IGZO protective layer corresponding to the area in which the light emitting area A1 is located, and reserve the IGZO protective layer corresponding to the area in which the non-light emitting area A2 is located, such that the reserved IGZO protective layer forms an IGZO protective layer 410. In this way, the IGZO protective layer 410 may be avoided from causing an interface loss to the light emitting area A1.

(2) performing annealing treatment on the IGZO protective layer 410 at a temperature of 380° C.

Figure 7B:
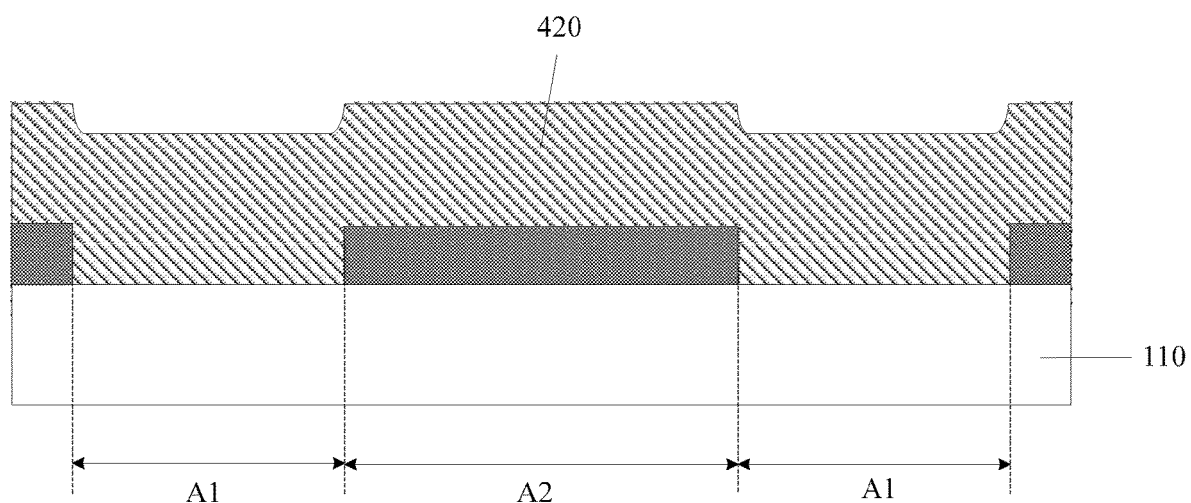

(3) forming a silicon nitride insulating layer 420, which covers the light emitting area A1 and the non-light emitting area A2 of the light guide plate 110, on the light guide plate 110, as shown in FIG. 7B.

Specifically, a silicon nitride insulating layer 420 which covers the light guide plate 110 is deposited on the light guide plate 110 through a plasma enhanced chemical vapor deposition (PECVD) method.

Figure 7C:
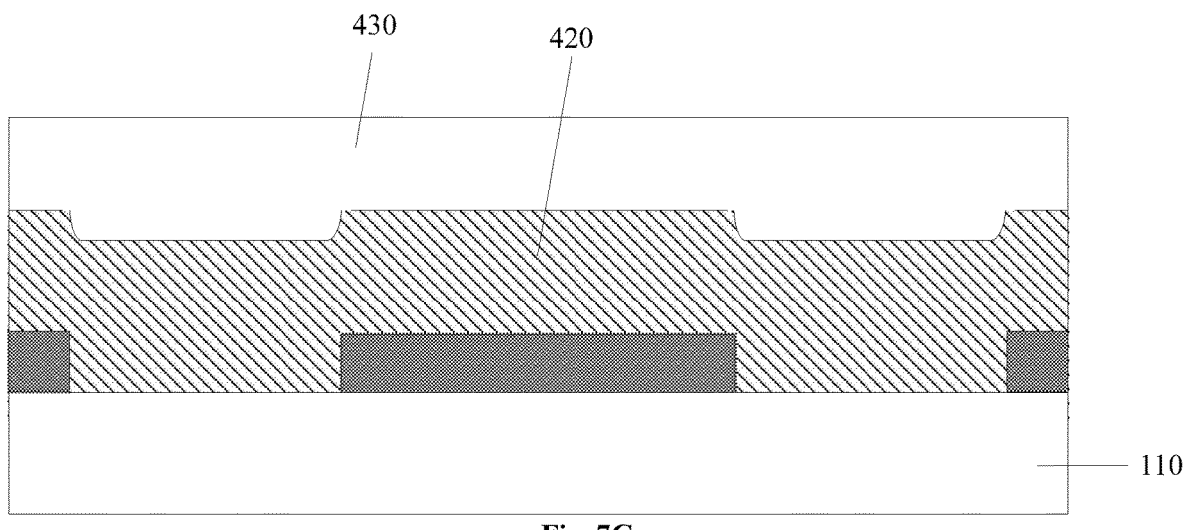

(4) forming an embossing adhesive 430, which covers the silicon nitride insulating layer 420, on the light guide plate 110, as shown in FIG. 7C.

Figure 7D:
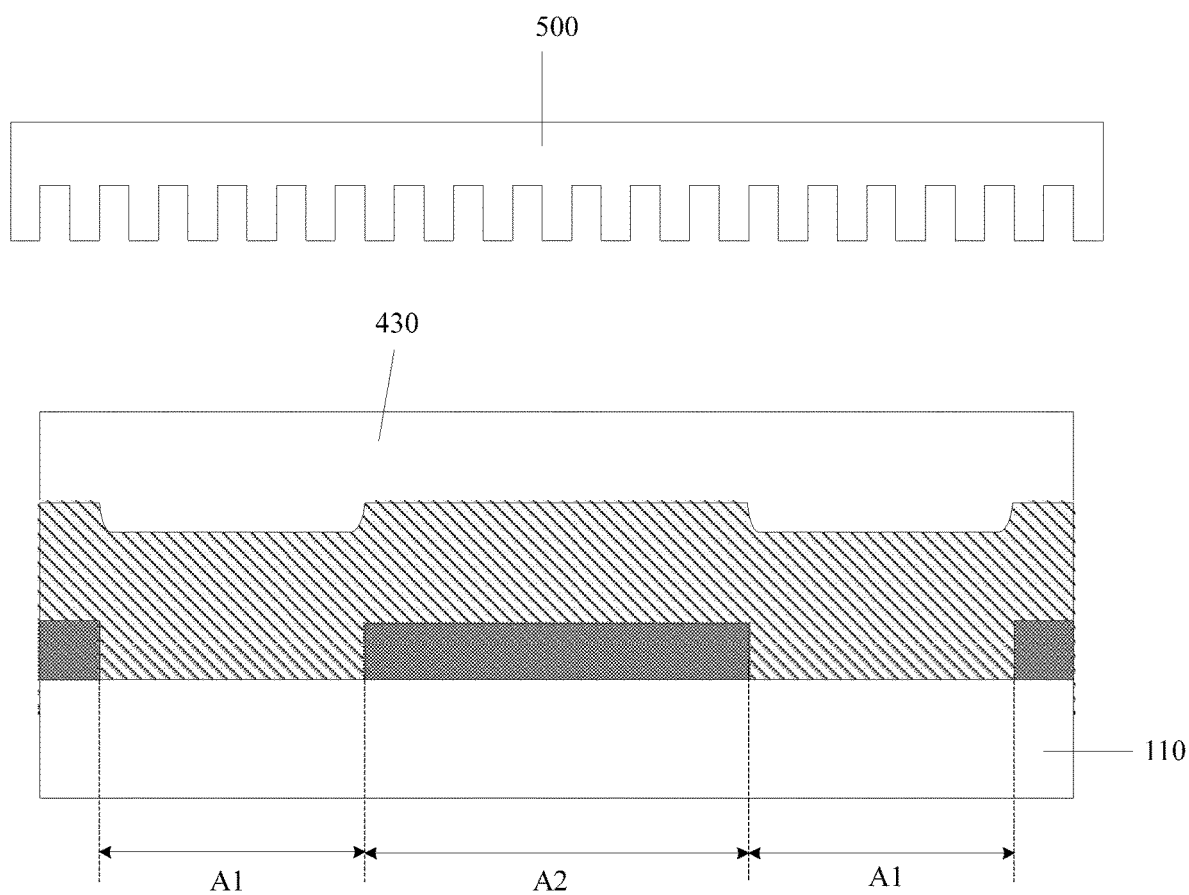

(5) embossing simultaneously each area of the embossing adhesive 430 with an embossing template 500, as shown in FIG. 7D.

Figure 7E:
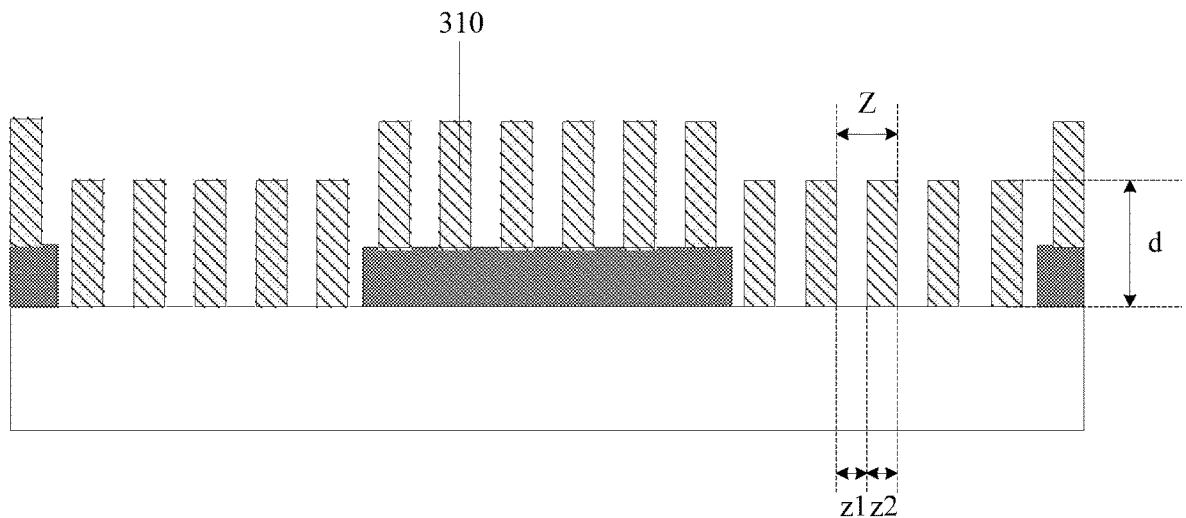

(6) adopting a dry etching process to enable the insulating layer to form grating structures 310 after curing treatment of the embossed embossing adhesive and removal of the embossing template, as shown in FIG. 7E. A gap exists between two adjacent grating structures 310, moreover, the widths of gaps between every two adjacent grating structures 310 are respectively the same. Where, the thickness d of the formed grating structure 310 may be 320 nm, and the period Z of the grating structure 310 may be 377 nm. Where, it should be noted that, the above thickness d is the distance between an upper surface of the grating structure 310 and an upper surface of the light guide plate. The above period Z is the sum of the width z2 of one grating structure 310 and the width z1 of a gap adjacent to the grating structure 310, that is, Z=z1+z2.

Of course, during practical applications, since the display effects of different application environments on display devices are different, therefore, the thickness and period of the grating structure 310 of the grating structure may be designed and determined according to actual application environments, and will not be defined herein.

Figure 7F:
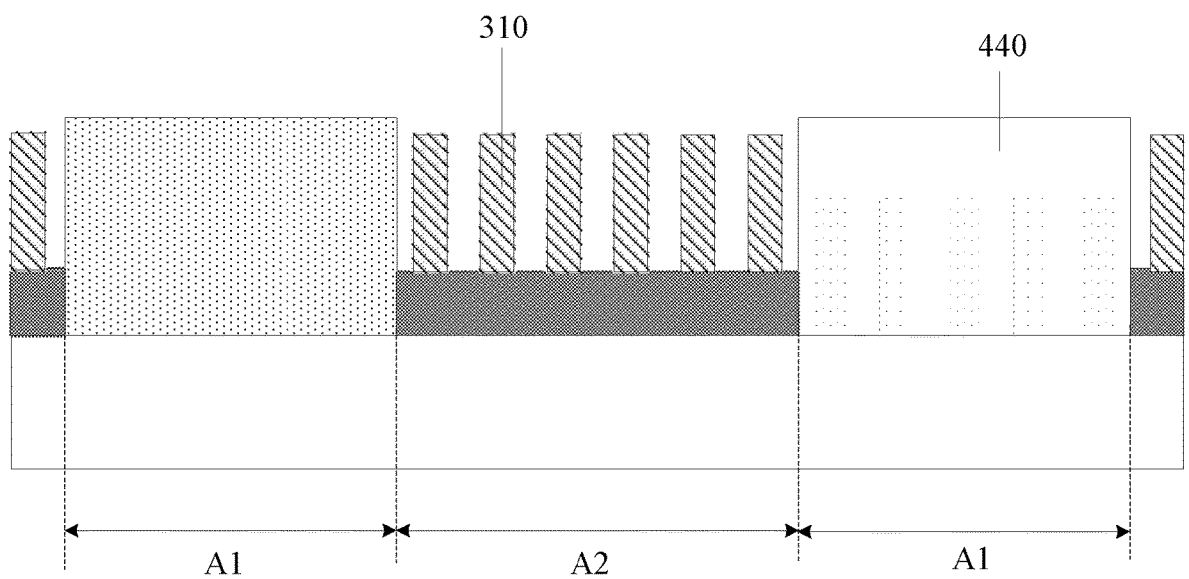

(7) forming a pattern of a photoresist layer 440 with multiple opening areas on the grating structure 310, where the opening areas are overlapped with the non-light emitting area A2 of the collimating backlight module, then the photoresist layer 440 only covers the grating structure 310 in the light emitting area A1, as shown in FIG. 7F.

Figure 7G:
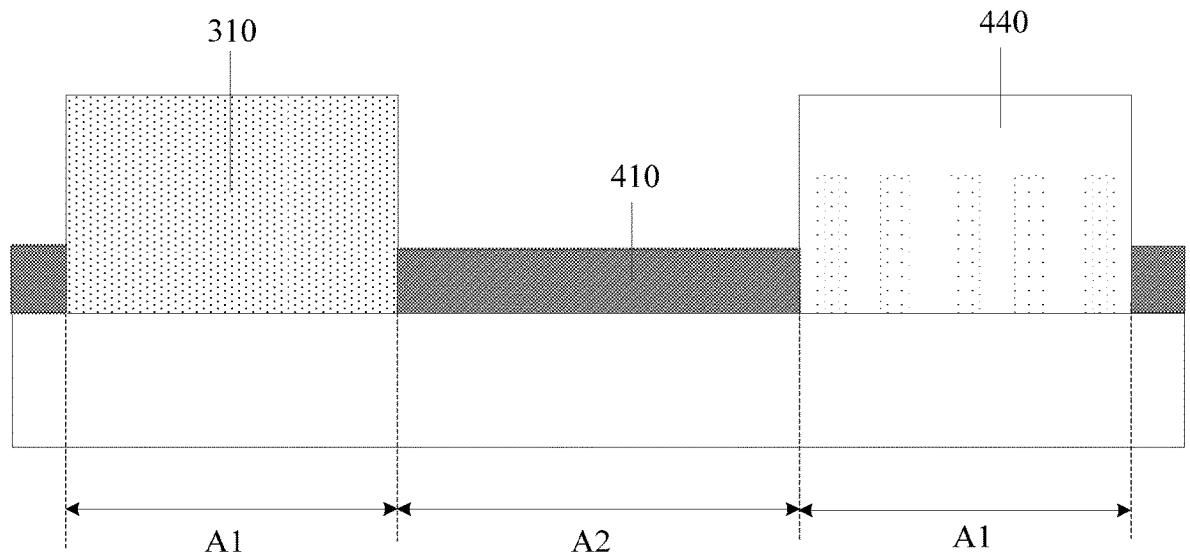

(8) adopting a dry etching process to remove the grating structure 310 in the corresponding non-light emitting area A2, reserve the protective layer 410 of the non-light emitting area A2, and reserve the photoresist layer 440 of the corresponding light emitting area A1, to reserve the grating structure 310 in the corresponding light emitting area A1, as shown in FIG. 7G. Where, the ratio of the etching rate at which the grating structure 310 is etched to the etching rate at which the IGZO protective layer 410 is etched is enabled to be 50:1.

Of course, during practical applications, the ratio of the etching rate at which the grating structure 310 is etched to the etching rate at which the IGZO protective layer 410 is etched may be designed and determined according to practical application environments, and will not be defined herein.

Figure 7H:
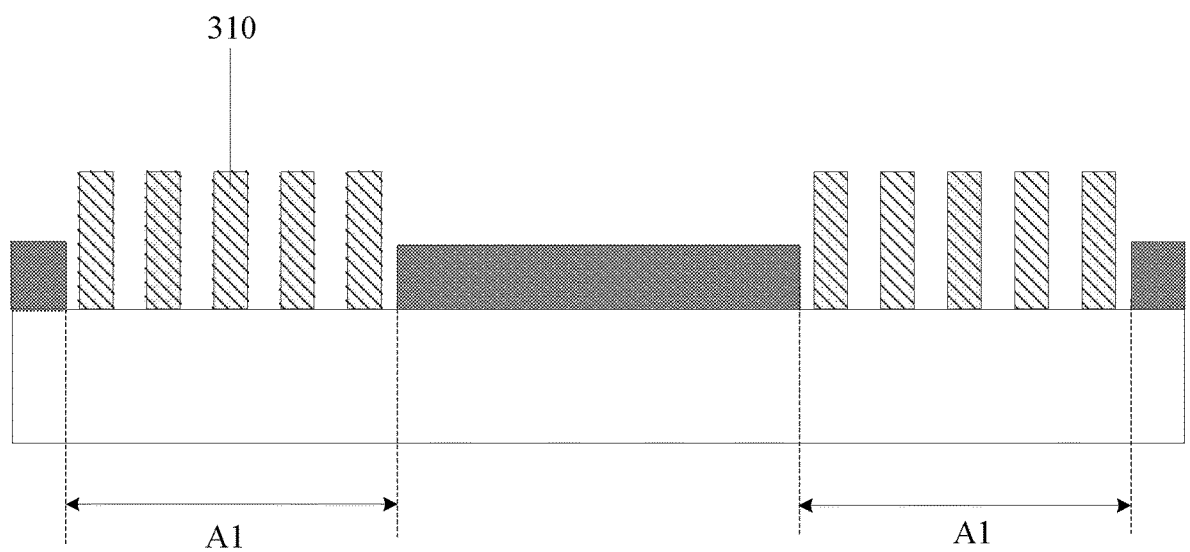

(9) peeling off the photoresist layer, and forming the light taking grating 310 which is only located in the light emitting area A1, such that the grating structures 310 in the same light emitting area A1 form the light taking grating in the light emitting area A1, as shown in FIG. 7H.

Figure 7I:
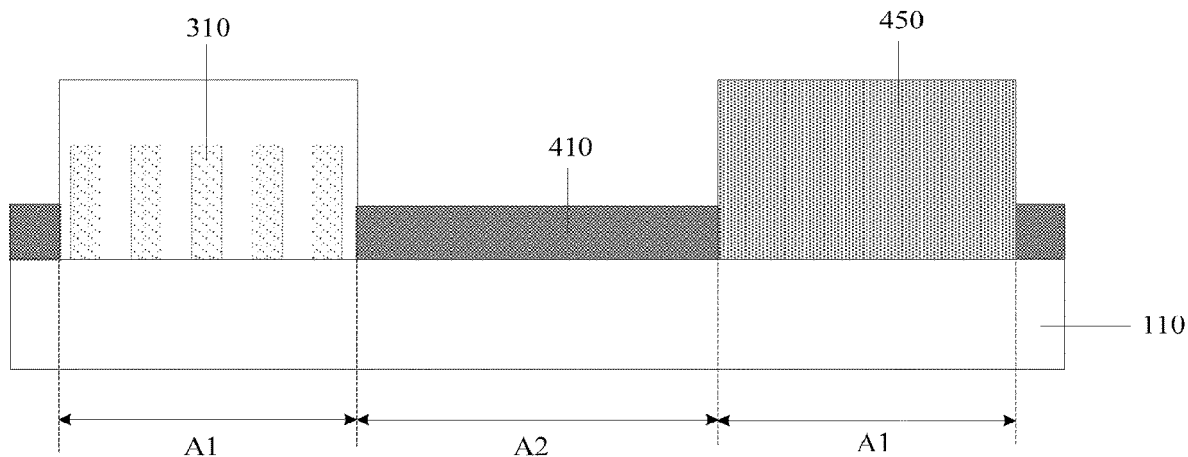

(10) adopting photoresist to form an anti-etching protective layer 450, which only covers the light taking grating of each light emitting area A1, on the light guide plate 110 which is formed with the light taking grating, as shown in FIG. 7I. Specifically, a photolithographic process is adopted to form an anti-etching protective layer 450.

Figure 7J:
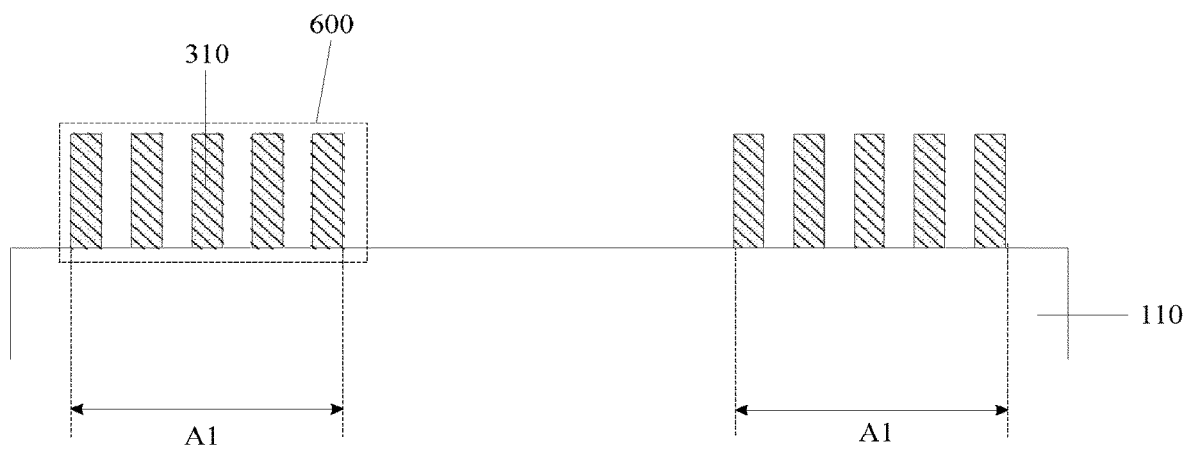

(11) removing an IGZO protective layer with an etching liquid, where the grating structure 310 is formed in the light emitting area A1 of the light guide plate 110, such that the grating structures 310 in the same light emitting area A1 form a light taking grating 600, as shown in FIG. 7J. Where, the etching liquid may include: sulfuric acid, nitric acid, additives and deionized water. For example, the mass ratio of sulfuric acid to nitric acid to additives to deionized water may be 8:4.5:2:76.

Figure 7K:
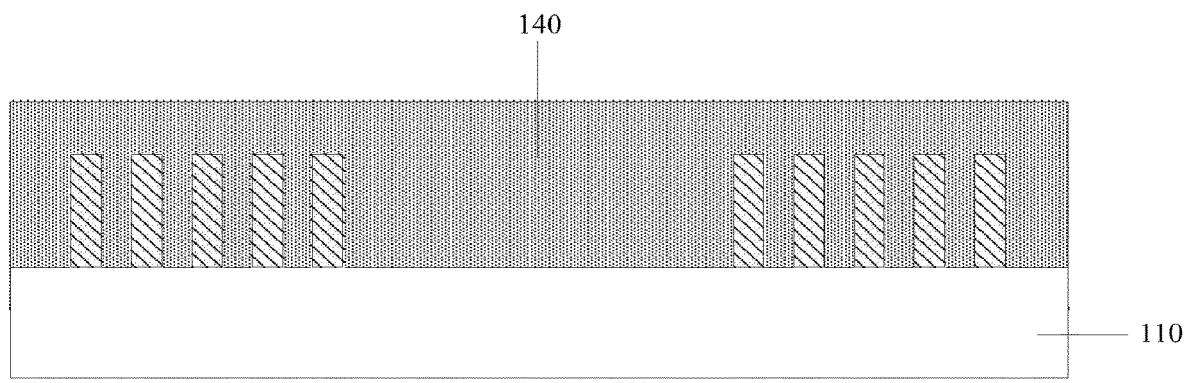

(12) forming a planarization layer 140, which covers the light guide plate 110, on the light guide plate 110, as shown in FIG. 7K.

Figure 7L:
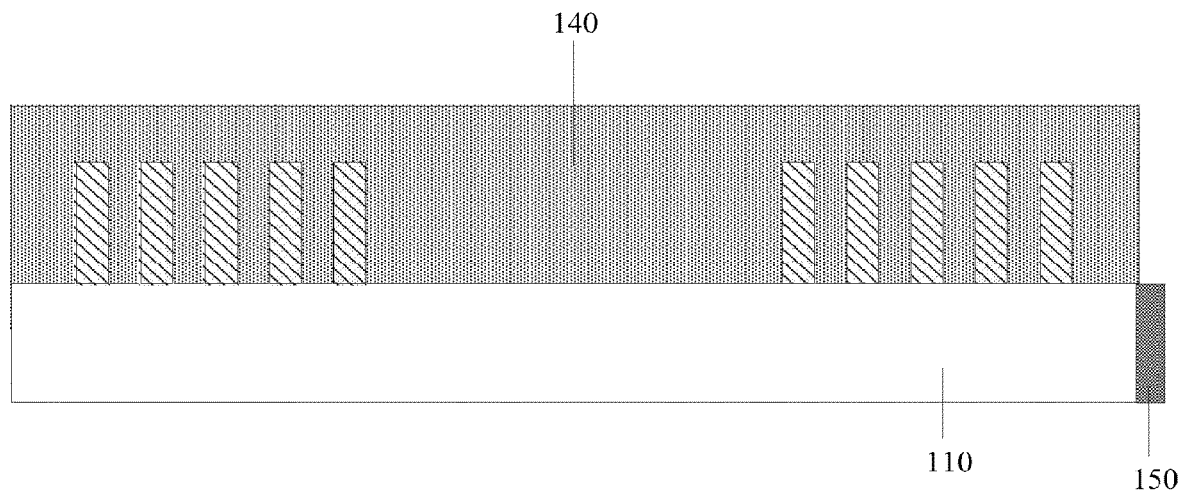

(13) forming a reflective layer 150 on the side opposite to the light inlet side of the light guide plate 110, as shown in FIG. 7L.

Figure 7M:
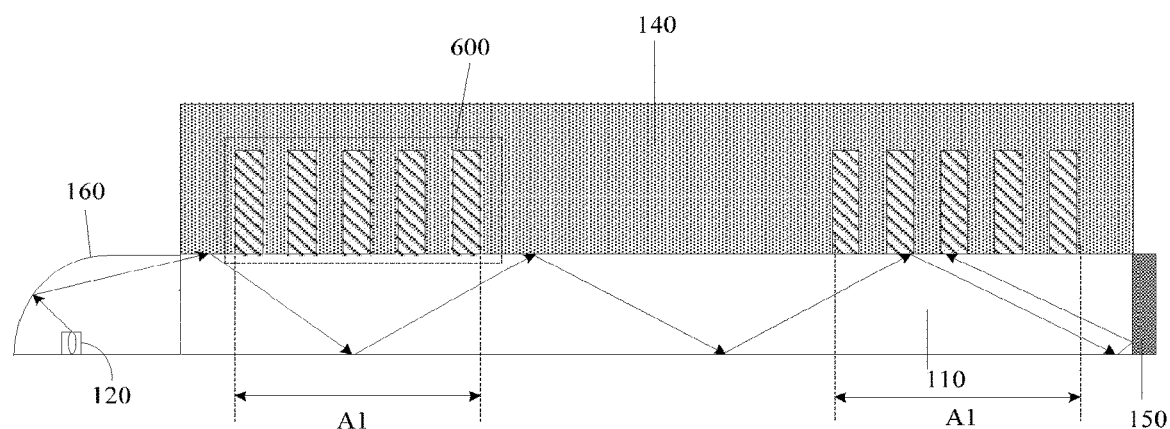

(14) forming a light source 120 and a reflective cover 160 on the light inlet side of the light guide plate 110, as shown in FIG. 7M.

Based on the same invention concept, an embodiment of the present disclosure further provides a collimating backlight module prepared by the above preparation method. The principles for solving problems by the collimating backlight module are similar to the principles of the above preparation method, therefore, for the implementation of the collimating backlight module, please refer to the implementation of the above preparation method, and the repeated part will not be repeated redundantly herein.

Specifically, as shown in FIG. 7M, the collimating backlight module may include: a light guide plate 110 and a light taking grating 600 arranged on one side of the light guide plate 110, where the orthographic projection of the light taking grating 600 in the light guide plate 110 is located in the light emitting area A1 of the collimating backlight module.

Of course, in an embodiment of the present disclosure, the collimating backlight module may include: a light guide plate, a protective layer arranged on one side of the light guide plate, and a light taking grating arranged on one side of the light guide plate, where the orthographic projection of the protective layer in the light guide plate is not overlapped with the light emitting area of the collimating backlight module, and the orthographic projection of the light taking grating in the light guide plate is located in the light emitting area of the collimating backlight module.

During specific implementation, in an embodiment of the present disclosure, as shown in FIG. 7M, the collimating backlight module may also include: a planarization layer 140 arranged on a side, deviating from the light guide plate 110, of the light taking grating 600, where the refractive index of the material of the planarization layer 140 may be smaller than the refractive index of the light guide plate, for example, the refractive index of the material of the planarization layer 140 may be smaller than 1.4.

During specific implementation, in an embodiment of the present disclosure, as shown in FIG. 7M, the collimating backlight module may also include: a light source 120 and a reflective cover 160 formed on the light inlet side of the light guide plate 110, and a reflective layer 150 formed on the side opposite to the light inlet side of the light guide plate 110.

Based on the same invention concept, an embodiment of the present disclosure further provides a display device, as shown in FIG. 1, the display device may include a collimating backlight module 100 provided in an embodiment of the present disclosure. Further, the display device further includes a liquid crystal display panel 200 arranged on the light emitting side of the collimating backlight module 100.

For the specific structure of the display device, please refer to the above description, and the specific structure will not be repeated redundantly herein. Moreover, the principles for solving problems by the present display device are similar to the principles of the above collimating backlight module, therefore, for the implementation of the present display device, please refer to the implementation of the above collimating backlight module, and the repeated part will not be repeated redundantly herein.

During specific implementation, the display device provided in an embodiment of the present disclosure may be a mobile phone, a tablet computer, a television, a display, a notebook computer, a digital photo frame, a navigator and any other display panels of products with a display function. The other essential components of the display device should be provided as understood by those skilled in the art, are not repeated redundantly herein, and also should not be deemed as a limitation to the present disclosure.

As to the collimating backlight module, the preparation method thereof and the display device provided in an embodiment of the present disclosure, a protective layer provided with multiple hollow areas are firstly formed on the light guide plate before a light taking grating is formed, such that the protective layer covers the light guide plate corresponding to the non-light emitting area, so as to protect the non-light emitting area of the light guide plate. In this way, when a light taking grating is formed on the light guide plate corresponding to the area at which the light emitting area is located, due to the protection effect of the protective layer on the non-light emitting area of the light guide plate, the light guide plate may be avoided from being etched, thereby further enabling the surface evenness of the non-light emitting area of the light guide plate to be favorable, and reducing light leakage of the non-light emitting area. Further, when the collimating backlight module prepared through the above method is applied to a display device, the display effect may be improved.

Evidently, those skilled in the art may make various modifications and variations to the present disclosure without departing from the spirit and scope of the present disclosure. Accordingly, the present disclosure is also intended to encompass these modifications and variations thereto so long as the modifications and variations come into the scope of the claims appended to the disclosure and their equivalents.

The invention claimed is:

1. A method for preparing a collimating backlight module, comprising:
  providing a light guide plate;
  forming a protective layer on a light emitting side of the light guide plate, wherein the protective layer simultaneously covers a light emitting area and a non-light emitting area of the light emitting side, a hollow area is formed on the protective layer, to expose the light emitting area of the light guide plate;
  forming a light taking grating on the light emitting area of the light guide; and
  removing the protective layer of the non-light emitting area of the light guide plate.

2. The method for preparing a collimating backlight module of claim 1, wherein the forming the protective layer on the light emitting side of the light guide plate, wherein the protective layer simultaneously covers the light emitting area and the non-light emitting area of the light emitting side, the hollow area is formed on the protective layer, to expose the light emitting area of the light guide plate comprises:
  forming at least one protective layer selected from a metal protective layer, a metal alloy protective layer or a metal oxide protective layer on the light guide plate; and
  performing wet etching on the formed protective layer, and forming a hollow area on the protective layer, to expose the light emitting area of the light guide plate.

3. The method for preparing a collimating backlight module of claim 2, wherein forming the metal oxide protective layer on the light guide plate comprises:
  forming at least one protective layer selected from an indium gallium zinc oxide (IGZO) protective layer, an indium tin oxide (ITO) protective layer or an indium zinc oxide (IZO) protective layer on the light guide plate.

4. The method for preparing a collimating backlight module of claim 3, wherein before the forming the light taking grating on the light emitting area of the light guide plate, the method further comprises:
  performing annealing treatment on the protective layer at a temperature range of 200° C. to 400° C.

5. The method for preparing a collimating backlight module of claim 1, wherein the removing the protective layer of the non-light emitting area of the light guide plate comprises:
  removing the protective layer with an etching liquid, wherein the etching liquid comprises: sulfuric acid, nitric acid, additives and deionized water.

6. The method for preparing a collimating backlight module of claim 5, wherein before the removing the protective layer of the non-light emitting area of the light guide plate, the method further comprises:
  forming an anti-etching protective layer, which only covers the light taking grating, on the light guide plate.

7. The method for preparing a collimating backlight module of claim 6, wherein the forming the anti-etching protective layer which only covers the light taking grating comprises:
  forming a photoresist layer, which only covers the light taking grating, on the light guide plate formed with the light taking grating.

8. The method for preparing a collimating backlight module of claim 1, wherein a thickness of the formed protective layer ranges from 10 nm to 40 nm.

9. The method for preparing a collimating backlight module of claim 1, wherein before removing the protective layer of the non-light emitting area of the light guide plate, the forming the light taking grating on the light emitting area of the light guide plate comprises:
  forming an insulating layer, which covers the light guide plate, on the light guide plate, wherein a refractive index of the insulating layer is greater than a refractive index of the light guide plate;
  adopting a composition process to enable the insulating layer to form grating structures on each area of the light guide plate;
  forming a photoresist layer with multiple opening areas on the grating structures, wherein the opening areas are overlapped with the non-light emitting area of the collimating backlight module;
  adopting a dry etching process to remove the grating structures in a corresponding non-light emitting area and reserve the protective layer of the non-light emitting area; and
  peeling off the photoresist layer, and forming the light taking grating which is only located in the light emitting area.

10. The method for preparing a collimating backlight module of claim 9, wherein the adopting the composition process to enable the insulating layer to form the grating structures on each area of the light guide plate comprises:
  adopting an embossing process or a transfer printing process to enable the insulating layer to form the grating structures on each area of the light guide plate.

11. The method for preparing a collimating backlight module of claim 10, wherein the adopting the embossing process to enable the insulating layer to form the grating structures on each area of the light guide plate comprises:
  forming an embossing adhesive, which covers the insulating layer, on the light guide plate;
  embossing simultaneously each area of the embossing adhesive with an embossing template; and
  adopting the dry etching process to enable the insulating layer to form the grating structures after curing treatment of the embossed embossing adhesive and removal of the embossing template.

12. The method for preparing a collimating backlight module of claim 9, wherein the forming the insulating layer, which covers the light guide plate, on the light guide plate comprises:
  forming a silicon nitride insulating layer, which covers the light guide plate, on the light guide plate.

13. The method for preparing a collimating backlight module of claim 1, wherein the light guide plate is made of glass.

14. The method for preparing a collimating backlight module of claim 1, wherein after the removing the protective layer of the non-light emitting area of the light guide plate, the method further comprises:

forming a planarization layer, which covers the light emitting side of the light guide plate, on the light guide plate.

15. The method for preparing a collimating backlight module of claim 14, wherein after the forming the planarization layer, which covers the light emitting side of the light guide plate, on the light guide plate, the method further comprises:

forming a reflective layer on a side opposite to a light inlet side of the light guide plate; and forming a light source and a reflective cover on the light inlet side of the light guide plate.

16. A collimating backlight module, wherein the collimating backlight module is prepared through the preparation method of claim 1.

17. A display device, comprising the collimating backlight module of claim 16.

* * * * *